(12) United States Patent
Sato

(10) Patent No.: US 11,959,940 B2
(45) Date of Patent: Apr. 16, 2024

(54) CONTACT PROBE

(71) Applicant: YOKOWO CO., LTD., Tokyo (JP)

(72) Inventor: Kenichi Sato, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 211 days.

(21) Appl. No.: 17/604,492

(22) PCT Filed: Mar. 24, 2020

(86) PCT No.: PCT/JP2020/012953
§ 371 (c)(1),
(2) Date: Oct. 18, 2021

(87) PCT Pub. No.: WO2020/217816
PCT Pub. Date: Oct. 29, 2020

(65) Prior Publication Data
US 2022/0214376 A1    Jul. 7, 2022

(30) Foreign Application Priority Data
Apr. 23, 2019  (JP) .................................. 2019-081956

(51) Int. Cl.
*G01R 1/067* (2006.01)
(52) U.S. Cl.
CPC .................. *G01R 1/06738* (2013.01)
(58) Field of Classification Search
CPC .................................................. G01R 1/06738
See application file for complete search history.

(56) References Cited

U.S. PATENT DOCUMENTS

| 4,417,206 A * | 11/1983 | Stowers | G01R 1/06738 |
| | | | 324/755.11 |
| 2006/0145719 A1* | 7/2006 | Jeong | G01R 1/06722 |
| | | | 324/754.08 |
| 2018/0080955 A1* | 3/2018 | Hsieh | G01R 1/06733 |
| 2018/0335447 A1 | 11/2018 | Yamamoto | |

FOREIGN PATENT DOCUMENTS

| JP | 2001-311746 A | 11/2001 |
| JP | 2002-134573 A | 5/2002 |
| JP | 2003-43104 A | 2/2003 |
| JP | 2003-161743 A | 6/2003 |
| JP | 2008-2852 A | 1/2008 |
| JP | 2012-052943 A | 3/2012 |
| JP | 2012-52943 A | 3/2012 |

(Continued)

OTHER PUBLICATIONS

Machine translation of Korean patent paublication KR-20110108108-A1 (Year: 2011).*

(Continued)

*Primary Examiner* — G. M. A Hyder
(74) *Attorney, Agent, or Firm* — XSENSUS LLP

(57) ABSTRACT

A contact probe capable of being used for an inspection of a semiconductor package in which a recess is formed in a terminal portion includes a plunger including a distal end portion that comes into contact with the terminal portion. The distal end portion includes a protruding portion protruding toward the terminal portion and a shoulder portion having a protruding height toward the terminal portion lower than that of the protruding portion.

22 Claims, 12 Drawing Sheets

(56) References Cited

FOREIGN PATENT DOCUMENTS

| | | |
|---|---|---|
| JP | 2012-522976 A | 9/2012 |
| JP | 2014-126363 A | 7/2014 |
| JP | 2015-516571 A | 6/2015 |
| JP | 2018-071991 A | 5/2018 |
| JP | 2018-194411 A | 12/2018 |
| KR | 10-2013-0004165 A | 1/2013 |

OTHER PUBLICATIONS

English translation of Written Opinion dated Jun. 30, 2020, corresponding PCT Application PCT/JP2020/012953, 5 pages.
International Search Report and Written Opinion dated Jun. 30, 2020, received for PCT Application PCT/JP2020/012953, Filed on Mar. 24, 2020, 12 pages including English Translation.

* cited by examiner

[DISTAL END FRONT VIEW]

[FRONT VIEW]

[DISTAL END FRONT VIEW]

[FRONT VIEW]

[DISTAL END FRONT VIEW]

[FRONT VIEW]

CONTACT PROBE

CROSS-REFERENCE TO RELATED APPLICATIONS

The present application is based on PCT filing PCT/JP2020/012953, filed Mar. 24, 2020, which claims priority to JP 2019-081956, filed Apr. 23, 2019, the entire contents of each are incorporated herein by reference.

TECHNICAL FIELD

The present invention relates to a contact probe.

BACKGROUND ART

For electrical contact between a semiconductor package to be inspected and an inspection device, a contact probe and a socket supporting the contact probe are used. In the socket, a plurality of contact probes corresponding to terminals provided in the semiconductor package are supported. When the socket is brought close to the semiconductor package to be inspected, a distal end of the contact probe comes into contact with the terminal on a semiconductor package side and is electrically connected.

For example, Patent Literature 1 discloses a technique relating to a socket capable of narrowing a support interval of a contact probe. Patent Literature 2 discloses a contact probe capable of reducing a risk of decreasing a strength of a plunger and a difficulty of tube processing.

CITATION LIST

Patent Literature

Patent Literature 1: JP-A-2018-071991
Patent Literature 2: JP-A-2018-194411

SUMMARY OF INVENTION

Technical Problem

Some of the terminals of the semiconductor package to be inspected have a recess as an indicator for image inspection in a mounting process. A shape of the recess can be variously set by a manufacturer of the semiconductor package. One of the terminals of the semiconductor package is a dimpled terminal portion 81 as shown in FIG. 21. The dimpled terminal portion 81 has a quarter spherical recess called a dimple 82 at a protruding corner portion of the terminal. This dimpled terminal portion 81 is used, for example, in a quad flat non-leaded package (QFN) for an in-vehicle device.

In the related art, in an inspection of the semiconductor package including the dimpled terminal portion 81, a contact probe having a wedge-shaped distal end portion 11J (or a cone or pyramid shaped distal end) plunger as shown in FIG. 22 has been used.

When the inspection is executed using the contact probe having the wedge-shaped distal end portion 11J, it is necessary to execute the inspection such that the distal end is brought into contact with a flat portion (a flat portion around the dimple 82) of the dimpled terminal portion 81 aiming at a pinpoint. However, due to an error, a variation, or the like in a positional relation with the semiconductor package to be conveyed and provided for the inspection, as shown in FIG. 23, a protruding end of a distal end portion 11J may enter an inside of the dimple 82. Even in this case, if an inside of the dimple 82 is in a clean state such as a dust free, even when the protruding end of the distal end portion 11J comes into contact with an inner surface of the dimple 82, or even when an inclined portion of the distal end portion 11J comes into contact with a periphery of the dimple 82, conduction between the distal end portion 11J and the dimpled terminal portion 81 can be secured.

However, the inside of the dimple 82 is not necessarily in the clean state such as the dust free. In a manufacturing process of the semiconductor package, there is a process of cutting a surface from which a terminal is exposed for each molding material and aligning the surface. After the cutting, cleaning is performed. However, since a size of the dimple 82 is extremely small, a cutting powder at a time of cutting may remain in the dimple 82 occasionally. When the protruding end of the distal end portion 11J enters the dimple 82 in a state in which the cutting powder remains in the dimple 82, normal conduction may be inhibited due to the cutting powder, and an accurate inspection result may not be obtained.

Therefore, as shown in FIG. 24, it is conceivable to use a plunger including a distal end portion 11K formed only by a flat surface that has a wedge shape in a side view but whose protruding end has a width enough to straddle the dimple 82. In this case, since the protruding end of the distal end portion 11K does not enter the inside of the dimple 82 and straddles the dimple 82, it is conceivable that, regardless of the state in the dimple 82, the conduction between the distal end portion 11K and the dimpled terminal portion 81 can be attained and the inspection can be executed. However, there is a problem in this case.

An error or a variation occurs in a positional relation between the distal end portion 11K and the semiconductor package to be conveyed and provided for the inspection. When deviation occurs in a contact position between the distal end portion 11K and the dimpled terminal portion 81, a portion of the flat surface of the distal end portion 11K may come out of the dimpled terminal portion 81 and come into contact with the molding material around the dimpled terminal portion 81. The molding material often contains glass fiber. When the distal end portion 11K comes into contact with the molding material, wear is larger than that in a case in which the distal end portion 11K of the plunger is in contact with the dimpled terminal portion 81, and a life of the contact probe is shortened. An accurate inspection result may not be obtained due to the distal end portion 11K being in contact with the molding material.

An object of the present invention is to provide a technique of a contact probe suitable for an inspection of a semiconductor package in which a recess is formed in a terminal portion of the semiconductor package.

Solution to Problem

An aspect of the present invention provides a contact probe capable of being used for an inspection of a semiconductor package in which a recess is formed in a terminal portion, the contact probe including a plunger including a distal end portion that comes into contact with the terminal portion, in which the distal end portion includes a protruding portion protruding toward the terminal portion and a shoulder portion having a protruding height toward the terminal portion lower than that of the protruding portion.

According to the present aspect, when the contact probe attempts to come into contact with the terminal portion, the protruding portion enters a recess, while the shoulder portion comes into contact with an outer peripheral portion (a flat surface around the recess of the terminal portion) of the recess of the terminal portion. Therefore, even in a situation in which a foreign matter such as dust or a cutting powder remains in the recess and a foreign matter is interposed between the protruding portion and an inside of the recess, conduction (electrical connection) between the contact probe and the terminal portion is secured by the contact of the shoulder portion with the terminal portion, and an accurate inspection can be executed. Further, according to the present aspect, since the shoulder portion is less likely to come into contact with the molding material around the terminal portion, a life of the contact probe can be extended. The contact probe suitable for the inspection of the semiconductor package in which the recess is formed in the terminal portion can be implemented.

In the contact probe according to the present aspect, even if the contact probe is used for the inspection of the semiconductor package having a flat terminal portion without a recess, since the protruding portion is brought into contact with the contact probe to secure the conduction between the contact probe and the terminal portion, it is also possible to execute an accurate inspection.

DESCRIPTION OF EMBODIMENTS

Hereinafter, examples of a preferred embodiment of the present invention will be described. However, a mode to which the present invention can be applied is not limited to the following embodiments. The drawings in which a distal end portion of a contact probe is enlarged show three orthogonal axes to indicate a common direction in each drawing. A Z axis of the three orthogonal axes indicates a direction parallel to an axis (a longitudinal direction) of the contact probe, and a Z axis positive direction is a direction from the contact probe toward a semiconductor package. An X axis positive direction is referred to as a forward direction, an X axis negative direction is referred to as a rearward direction, a Y axis positive direction is referred to as a rightward direction, and a Y axis negative direction is referred to as a leftward direction.

First Embodiment

Figure 1:
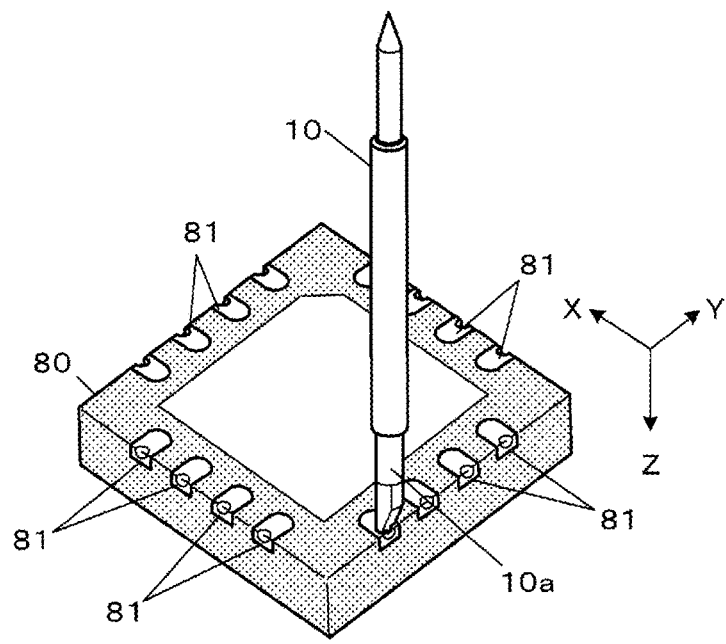
FIG. 1 is a perspective view showing a state of an inspection of a contact probe and a semiconductor package according to a first embodiment.

FIG. 1 is a perspective view showing a state of an inspection of a contact probe and a semiconductor package according to a first embodiment.

A contact probe 10 is designed to be usable for an inspection of a semiconductor package 80.

The semiconductor package 80 is a non-lead type semiconductor package including a dimpled terminal portion 81 as a connection terminal soldered to a mounting substrate. In FIG. 1, a shaded portion around the dimpled terminal portion 81 is a molding material.

Figure 2:
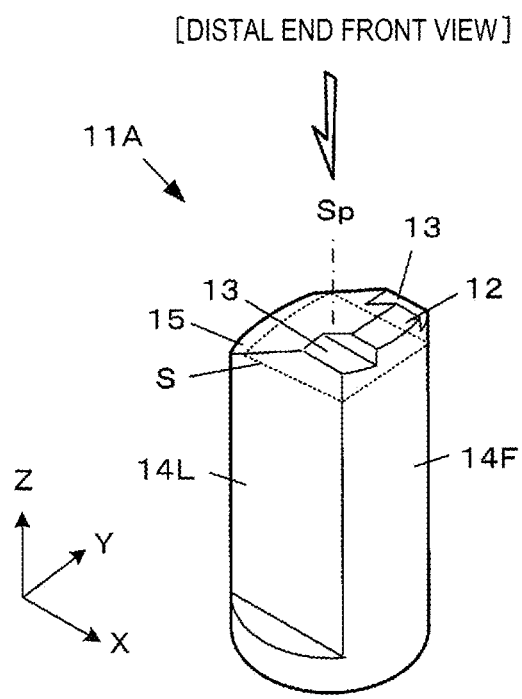
FIG. 2 is an enlarged perspective view of a distal end portion of the contact probe according to the first embodiment.

FIG. 2 is an enlarged perspective view of a distal end portion 11A (corresponding to a lower end portion of the contact probe 10 shown in FIG. 1) of the contact probe 10.

More specifically, the distal end portion 11A corresponds to a distal end portion of a plunger 10a (see FIG. 1) provided in the contact probe 10.

Figure 3:
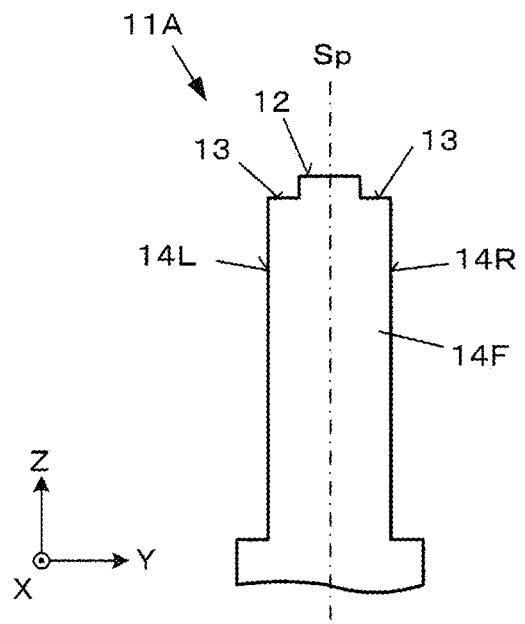
FIG. 3 is a front view of the distal end portion of the contact probe according to the first embodiment as viewed from a direction perpendicular to a probe axis.

FIG. 3 is a front view (a view showing a surface facing the X axis positive direction) of the distal end portion 11A of the contact probe 10 as viewed from a direction (the X axis positive direction) perpendicular to a probe axis Sp (a longitudinal axis of the contact probe 10).

The distal end portion 11A of the contact probe 10 includes 1) a protruding portion 12 that protrudes in a distal end direction (the Z axis positive direction) and that is located at a position away from a probe center in a distal end front view, and 2) a shoulder portion 13 having a protruding height in the distal end direction lower than that of the protruding portion 12. Here, the "distal end front view" means a direction of a visual line when the distal end portion 11A is viewed from an axial direction (the Z axis positive direction) of the probe axis Sp as shown in FIG. 2.

A front surface 14F (a surface facing the X axis positive direction) of the distal end portion 11A and a back surface 14B (a surface facing the X axis negative direction) of the distal end portion 11A are formed such that a part of a side surface of a cylinder, which is a basic shape of the plunger 10a, remains as it is. A flat surface 14R and a flat surface 14L are respectively formed at left and right side surfaces (surfaces facing the Y axis positive direction and the Y axis negative direction) of the distal end portion 11A. In the distal end portion 11A, an inclined surface 15 is formed from the back surface 14B of the distal end portion toward the front surface 14F of the distal end portion such that a cross-sectional area of a probe cross section S (a cross section whose normal line is oriented in the Z axis direction) decreases toward the distal end.

The protruding portion 12 and the shoulder portion 13 are formed at an inclined upper portion of the inclined surface 15, and are at a position closer to the X axis positive direction with respect to the probe center (a position of the probe axis Sp) in the distal end front view.

A protruding end of the protruding portion 12 has a flat shape whose normal line is parallel to the probe axis Sp.

Similarly to the protruding portion 12, a distal end of the shoulder portion 13 also has a flat shape whose normal line is parallel to the probe axis Sp.

When the distal end portion 11A is viewed in the distal end front view, the shoulder portions 13 are located on both sides interposing the protruding portion 12 in a circumferential direction. It can be said that the distal end portion 11A has a convex stepped shape in which the shoulder portions 13 are formed on both sides of the one protruding portion 12. A plurality of the shoulder portions 13 are located around the protruding portion 12. When viewed from a left side surface (the Y axis negative direction) or a right side surface (the Y axis positive direction), the distal end portion 11A has a one-sided wedge shape.

Figure 4:
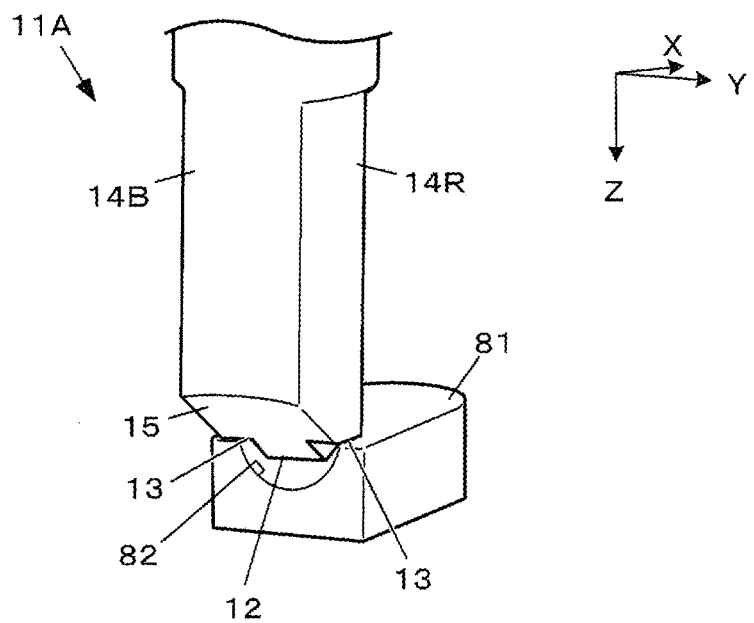
FIG. 4 is a view (No. 1) showing a state in which the distal end portion according to the first embodiment is brought into contact with a dimpled terminal portion in a positional relation in which a protruding portion enters a recess.
Figure 5:
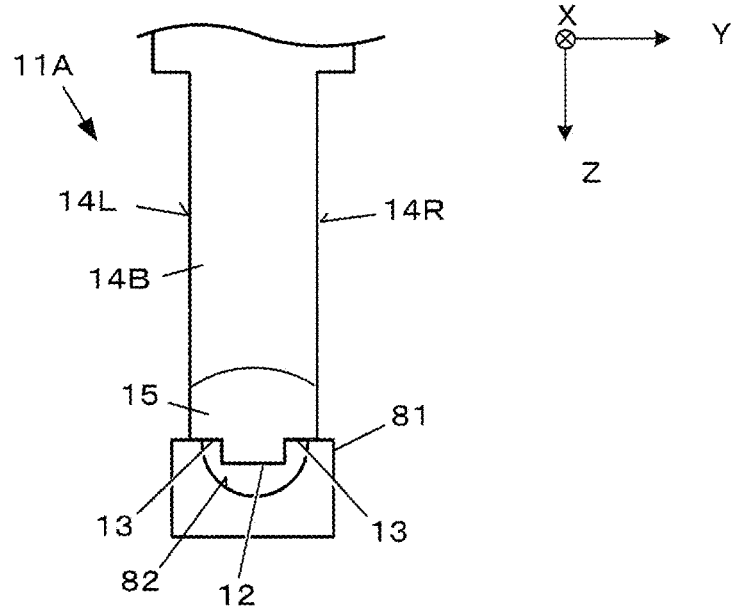
FIG. 5 is a view (No. 2) showing a state in which the distal end portion according to the first embodiment is brought into contact with the dimpled terminal portion in the positional relation in which the protruding portion enters the recess.

FIGS. 4 and 5 are views showing a state in which the distal end portion 11A is brought into contact with the dimpled terminal portion 81 in a positional relation in which the protruding portion 12 enters the dimple 82 (the recess) of the dimpled terminal portion 81. Specifically, FIG. 4 is a view of the distal end portion 11A as viewed obliquely behind the distal end portion 11A, and FIG. 5 is a view of the distal end portion 11A as viewed from a package outer circumferential direction (a back surface side of the distal end portion 11A) of the dimpled terminal portion 81.

The distal end portion 11A is formed in a shape in which, when the protruding portion 12 is moved toward the dimple 82 of the dimpled terminal portion 81, the shoulder portion 13 comes into contact with a periphery (a flat portion of the dimpled terminal portion 81, a flat portion around the dimple 82) of the dimple 82 of the dimpled terminal portion 81 before the protruding end of the protruding portion 12 reaches a bottom of the dimple 82.

Specifically, a left-right width (a width in the Y axis direction) of the protruding portion 12 is set to be smaller than a left-right width (a diameter of a sphere when the dimple 82 is a quarter spherical recess) of the dimple 82 of the dimpled terminal portion 81 of the semiconductor package 80 to be inspected. A protruding dimension (a height from the shoulder portion 13 in the Z axis direction: a height of the step) of the protruding portion 12 is set to be smaller than the maximum depth (a radius of the sphere when the dimple 82 is the quarter spherical recess) from the flat surface around the dimple 82 of the dimpled terminal portion 81 to a bottom surface of the dimple 82. That is, a difference between the protruding height of the protruding end of the protruding portion 12 and the protruding height of the shoulder portion 13 is set to be smaller than the maximum depth of the dimple 82.

Therefore, in a positional relation in which the protruding portion 12 enters the dimple 82, when the contact probe 10 approaches the dimpled terminal portion 81, the protruding portion 12 enters the dimple 82, and the shoulder portion 13 abuts against the flat surface around the dimple 82. Therefore, even if a foreign matter remains in the dimple 82, the shoulder portion 13 is brought into direct contact with the flat surface of the dimpled terminal portion 81 around the dimple 82 to be reliably conducted, and the inspection of the semiconductor package 80 can be accurately executed regardless of the presence or absence of the foreign matter in the dimple 82.

The shape of the dimple 82 according to the present embodiment is a substantially quarter sphere (approximately ¼ sphere) shape opened in two directions which are a side with which the contact probe 10 is in contact and an outer circumferential side of four sides of a package. Therefore, the protruding portion 12 enters the dimple 82, so that the foreign matter remaining in the dimple 82 can be pushed out from the dimple 82.

Figure 6:
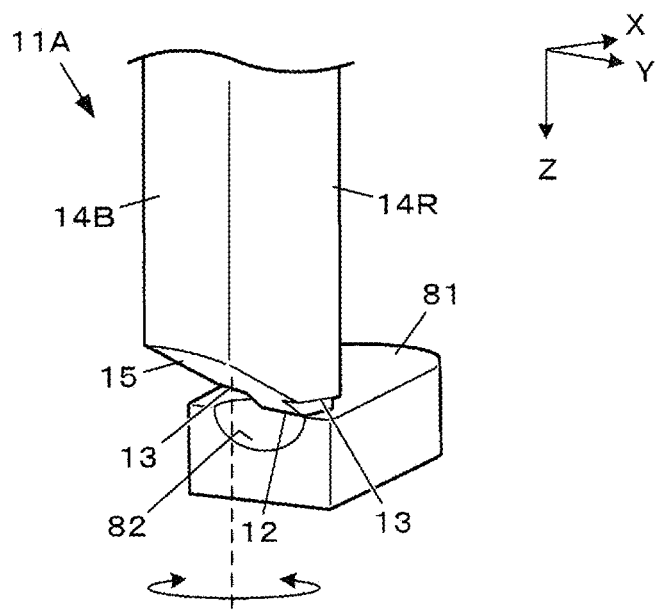
FIG. 6 is a view (No. 1) showing a state in which the distal end portion according to the first embodiment is brought into contact with the dimpled terminal portion in a positional relation in which the protruding portion is separated from the recess.
Figure 7:
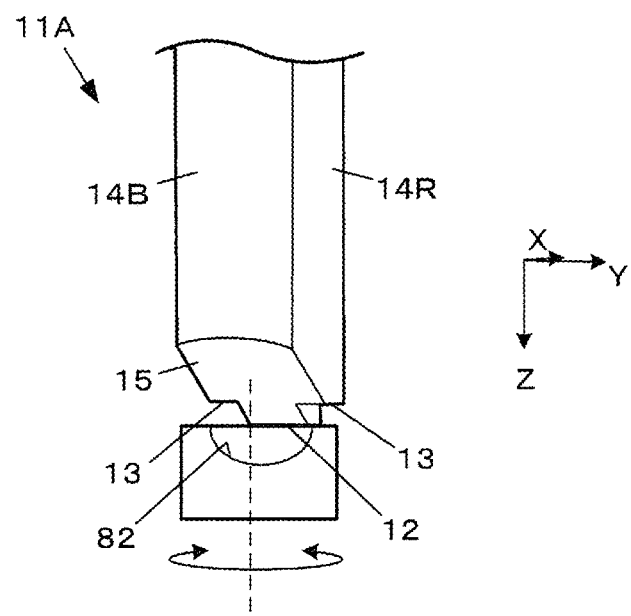
FIG. 7 is a view (No. 2) showing a state in which the distal end portion according to the first embodiment is brought into contact with the dimpled terminal portion in the positional relation in which the protruding portion is separated from the recess.

FIGS. 6 and 7 are views showing a state in which the distal end portion 11A is brought into contact with the dimpled terminal portion 81 in a positional relation in which the protruding portion 12 is separated from the dimple 82. FIG. 6 is a view of the distal end portion 11A as viewed obliquely behind the distal end portion 11A, and FIG. 7 is a view of the distal end portion 11A as viewed from the package outer circumferential direction (the back surface side of the distal end portion 11A) of the dimpled terminal portion 81.

In the present embodiment, the distal end portion 11A is formed in a shape in which, when the protruding portion 12 is moved toward the dimple 82, the shoulder portion 13 comes into contact with the periphery of the dimple 82 of the dimpled terminal portion 81 before the protruding end of the protruding portion 12 reaches the bottom of the dimple 82. If in the positional relation in which the protruding portion 12 is separated from the dimple 82, the protruding portion 12 comes into direct contact and conducts with the flat surface around the dimple 82. The semiconductor package 80 to be conveyed and provided for the inspection is not always provided at an accurate same position, and an error or a variation occurs in the providing position. Therefore, in the positional relation in which the protruding portion 12 is separated from the dimple 82, the distal end portion 11A may come into contact with the dimpled terminal portion 81 to perform a test. However, even in this case, the protruding portion 12 is brought into direct contact with the flat surface around the dimple 82, and reliable conduction can be achieved.

Focusing on the shoulder portion 13, the shoulder portion 13 at either one of the left and right sides protrudes from the dimpled terminal portion 81. However, since the protruding height of the shoulder portion 13 is smaller than the protruding height of the protruding portion 12, the shoulder portion 13 does not touch a molding portion (a portion of the molding material around the dimpled terminal portion 81). A material forming the molding portion often contains a glass fiber material. In the manufacturing process of the semiconductor package 80, a flat surface may be formed by collectively cutting the contact surface with the contact probe with the molding portion and the dimpled terminal portion 81. In this case, when the shoulder portion 13 comes into contact with a surface of the molding portion, the shoulder portion 13 is worn as if the shoulder portion 13 is brought into contact with sandpaper, and the shoulder portion 13 is worn more than when the shoulder portion 13 comes into contact with the flat portion (the flat surface) of the dimpled terminal portion 81. However, in the present embodiment, since the shoulder portion 13 is maintained in a state of being away from the molding portion, the wear does not occur.

Figure 8:
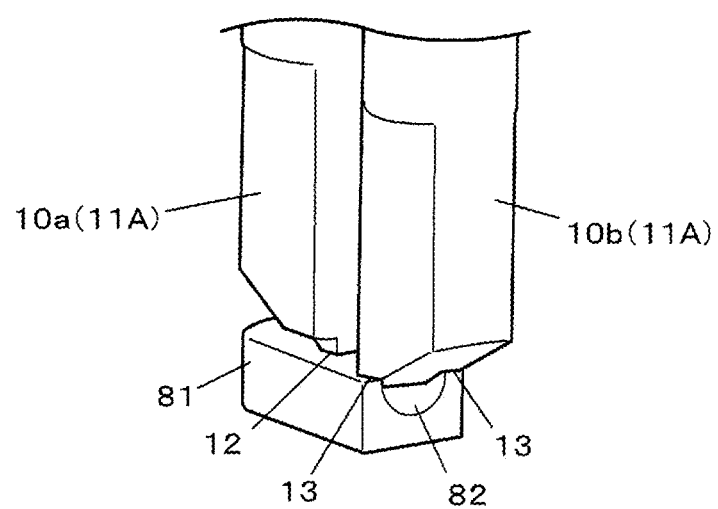
FIG. 8 is a perspective view showing a state of Kelvin measurement using the contact probe including the distal end portion according to the first embodiment.

FIG. 8 is a perspective view showing a state of Kelvin measurement using the contact probe including the distal end portion 11A. A first contact probe 10a and a second contact probe 10b are brought into contact with the one dimpled terminal portion 81.

As described above, the protruding portion 12 and the shoulder portion 13 are formed at the position offset from the probe center in the distal end front view. Therefore, when the first contact probe 10a and the second contact probe 10b are set to a relative posture (in other words, a relative posture in which the front surfaces 14F of the first contact probe 10a and the second contact probe 10b face each other back to back) in which the protruding portions 12 of the first contact probe 10a and the second contact probe 10b are brought close to each other, the Kelvin measurement can be executed by simultaneously bringing the two probes into contact with the minimum dimpled terminal portion 81.

Second Embodiment

Next, a second embodiment will be described. The same elements as those according to the first embodiment are denoted by the same reference numerals as those according to the first embodiment, and a duplicate description thereof will be omitted.

Figure 9:
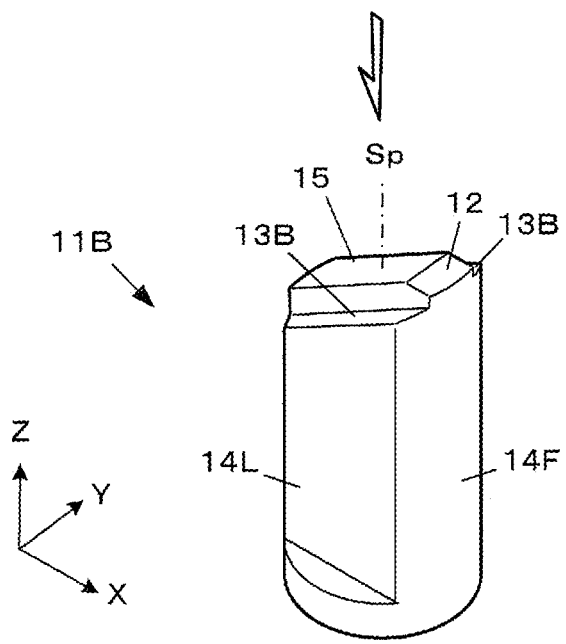
FIG. 9 is an enlarged perspective view of a distal end portion of a contact probe according to a second embodiment.

FIG. 9 is an enlarged perspective view of a distal end portion 11B of the contact probe 10 according to the second embodiment.

Figure 10:
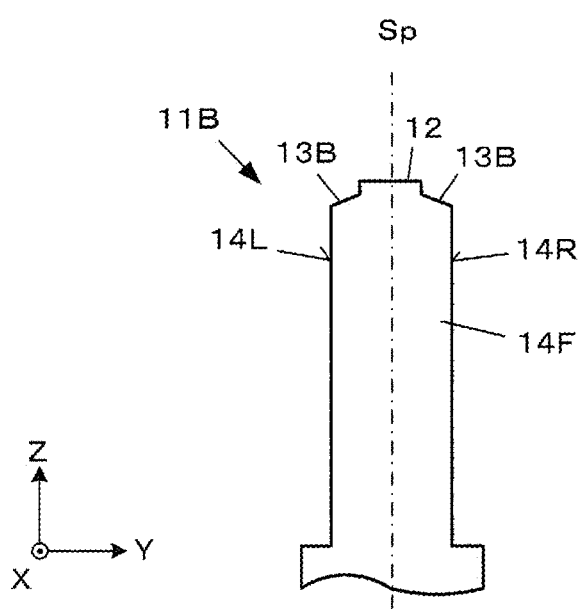
FIG. 10 is a front view of the distal end portion of the contact probe according to the second embodiment as viewed from a direction perpendicular to a probe axis.

FIG. 10 is a front view (a view showing a surface facing the X axis positive direction) of the distal end portion 11B of the contact probe 10 according to the second embodiment as viewed from a direction (the X axis positive direction) perpendicular to the probe axis Sp (the longitudinal axis of the contact probe 10).

Similarly to the distal end portion 11A, the distal end portion 11B is also formed in a shape in which, when the protruding portion 12 is moved toward the dimple 82, a shoulder portion 13B comes into contact with a periphery of the dimple 82 of the dimpled terminal portion 81 before a protruding end of the protruding portion 12 reaches a bottom of the dimple 82.

Specifically, the distal end portion 11B has a shape in which a cross-sectional area of the probe cross section S decreases toward the distal end. A protruding end of the protruding portion 12 has a flat shape whose normal line is parallel to the probe axis Sp. However, a distal end of the shoulder portion 13B of the distal end portion 11B has an inclined shape. The shoulder portion 13B has an inclination direction parallel to the inclined surface 15 and an inclination angle parallel to the inclined surface 15 and an intersecting portion with the front surface 14F, that is, the distal end of the shoulder portion 13B has an inclined shape. The maximum value of the difference between the protruding height of the protruding end of the protruding portion 12 and the protruding height of the shoulder portion 13B is set to be smaller than the maximum depth of the dimple 82. The shoulder portion 13B may be inclined in a direction opposite to the inclination direction of the inclined surface 15.

Figure 11:
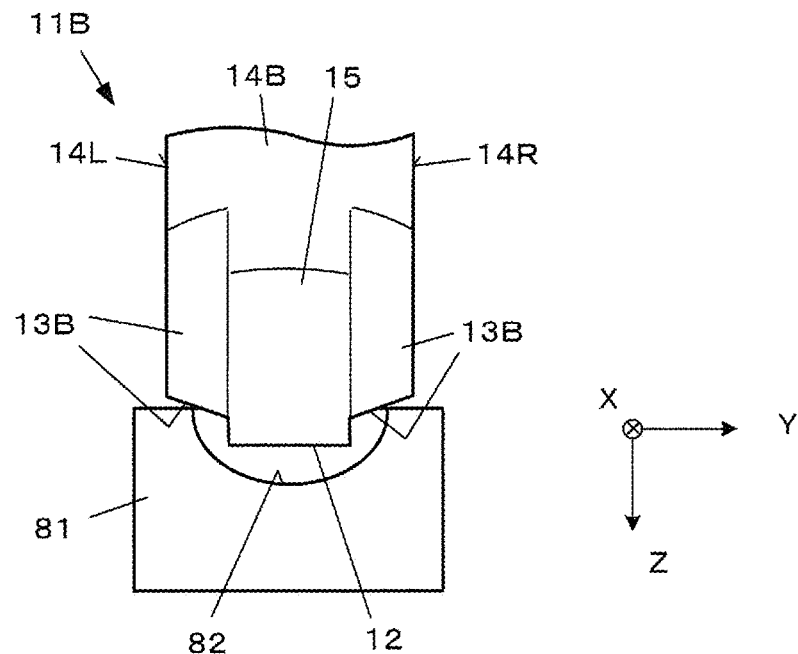
FIG. 11 is a view showing a state in which the distal end portion according to the second embodiment is brought into contact with the dimpled terminal portion in a positional relation in which a protruding portion enters a recess.

FIG. 11 is a view showing a state in which the distal end portion 11B is brought into contact with the dimpled terminal portion 81 in a positional relation in which the protruding portion 12 enters the dimple 82, and is a view of the distal end portion 11B as viewed from a package outer circumferential direction (a back surface side of the distal end portion 11B) of the dimpled terminal portion 81.

The protruding portion 12 enters the dimple 82 and is not in contact with an inner surface of the dimple 82. However, the shoulder portion 13B is in point contact with an outer edge portion of the dimple 82 to secure conduction. Therefore, also in the second embodiment, the same effects as the first embodiment can be attained. While the shoulder portion 13 is in surface contact or line contact with the dimpled terminal portion 81 in the first embodiment, the shoulder portion 13B is in point contact with the dimpled terminal portion 81 in the second embodiment. Therefore, it is less likely to pinch a foreign matter than in the first embodiment. Therefore, in the second embodiment, a more accurate inspection result may be obtained as compared with the first embodiment. Also in the second embodiment, the Kelvin measurement can be executed in the same manner as in the first embodiment.

Third Embodiment

Next, a third embodiment will be described. The same elements as those according to the first embodiment or the second embodiment are denoted by the same reference numerals, and a duplicate description thereof will be omitted.

Figure 12:
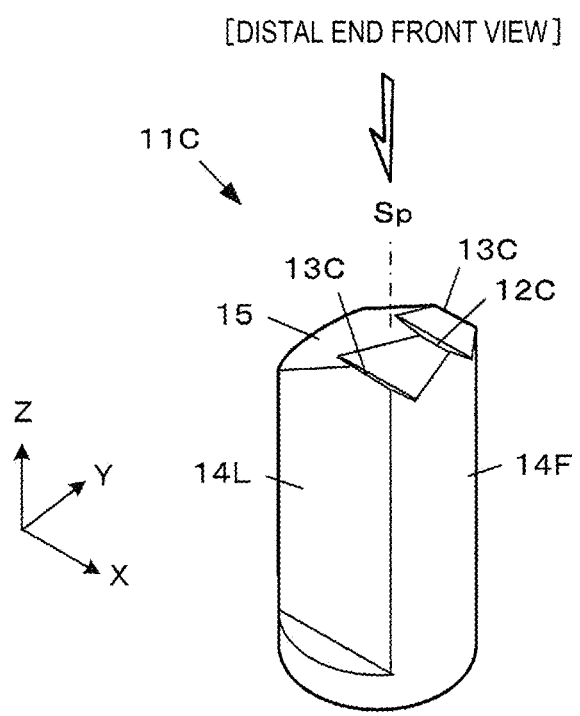
FIG. 12 is an enlarged perspective view of a distal end portion of a contact probe according to a third embodiment.

FIG. 12 is an enlarged perspective view of a distal end portion 11C of the contact probe 10 according to the third embodiment.

Figure 13:
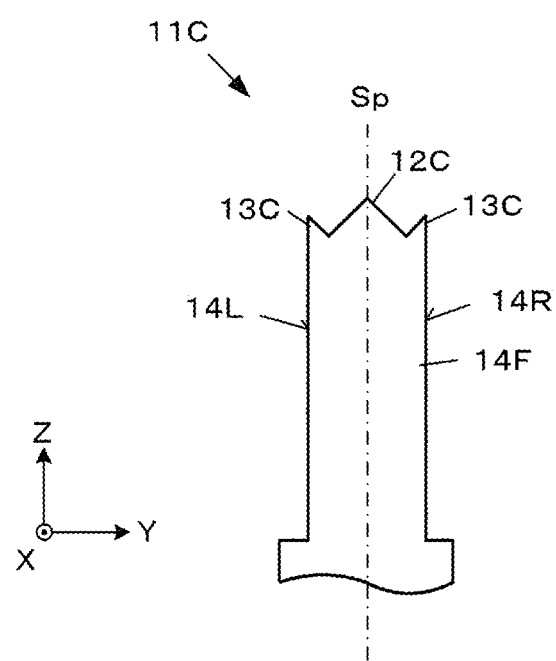
FIG. 13 is a front view of the distal end portion of the contact probe according to the third embodiment as viewed from a direction perpendicular to a probe axis.

FIG. 13 is a front view (a view showing a surface facing the X axis positive direction) of the distal end portion 11C of the contact probe 10 as viewed from a direction (the X axis positive direction) perpendicular to the probe axis Sp (a longitudinal axis of the contact probe 10).

Similarly to the distal end portion 11A and the distal end portion 11B, the distal end portion 11C is also formed in a shape in which, when the protruding portion 12C is moved toward the dimple 82, a shoulder portion 13C comes into contact with a periphery of the dimple 82 of the dimpled terminal portion 81 before a protruding end of the protruding portion 12C reaches a bottom of the dimple 82. That is, the maximum value of a difference between a protruding height of a protruding end of the protruding portion 12 and a protruding height of the shoulder portion 13C is set to be smaller than the maximum depth of the dimple 82.

The distal end portion 11C has a shape in which a cross-sectional area of a probe cross section decreases toward a distal end. The protruding portion 12C includes a protruding end having a chevron shape in a front view as viewed from the X axis positive direction, and a distal end of the protruding portion 12C forms one ridgeline in a front-rear direction (a direction along the X axis direction). The shoulder portion 13C also includes a protruding end having a chevron shape in the front view, and a distal end of the shoulder 13C forms one ridgeline in the front-rear direction.

Figure 14:
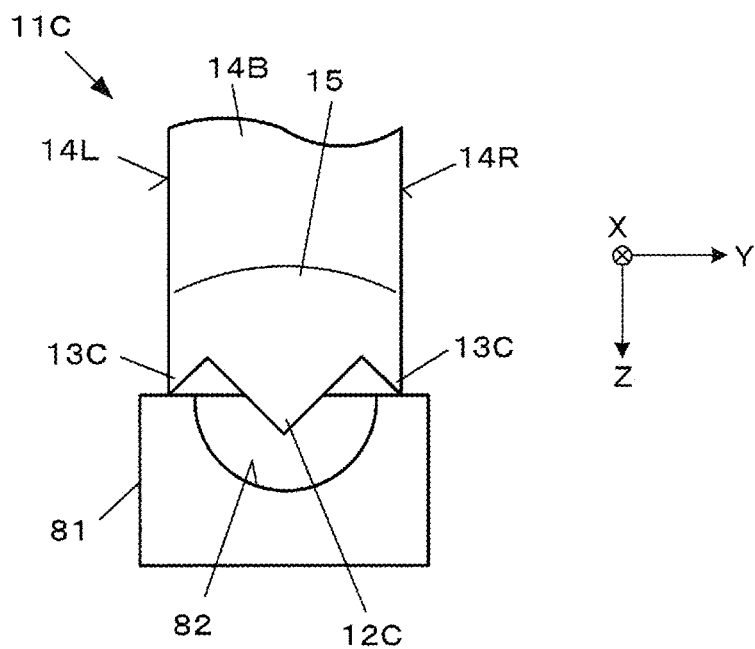
FIG. 14 is a view showing a state in which the distal end portion according to the third embodiment is brought into contact with the dimpled terminal portion in a positional relation in which a protruding portion enters a recess.

FIG. 14 is a view showing a state in which the distal end portion 11C is brought into contact with the dimpled terminal portion 81 in a positional relation in which the protruding portion 12C enters the dimple 82, and is a view of the distal end portion 11C as viewed from a package outer circumferential direction (a back surface side of the distal end portion 11C) of the dimpled terminal portion 81.

The protruding portion 12C enters the dimple 82 and is not in contact with an inner surface of the dimple 82. However, the shoulder portion 13C is in point contact with an outer edge portion (a flat surface around the dimple 82) of the dimple 82 to secure conduction. Therefore, also in the third embodiment, the same effects as the first embodiment can be attained. Also in the third embodiment, as in the second embodiment, since the shoulder portion 13C is in point contact with the dimpled terminal portion 81. Therefore, it is less likely to pinch a foreign matter than in the first embodiment. Therefore, in the third embodiment, a more correct inspection result may be obtained as compared with the first embodiment. Also in the third embodiment, the Kelvin measurement can be executed in the same manner as in the first embodiment and the second embodiment.

Several embodiments have been described above. However, the mode to which the present invention can be applied is not limited to the above-described embodiments, and the addition, omission, and change of the constituent elements can be executed as appropriate.

Figure 15:
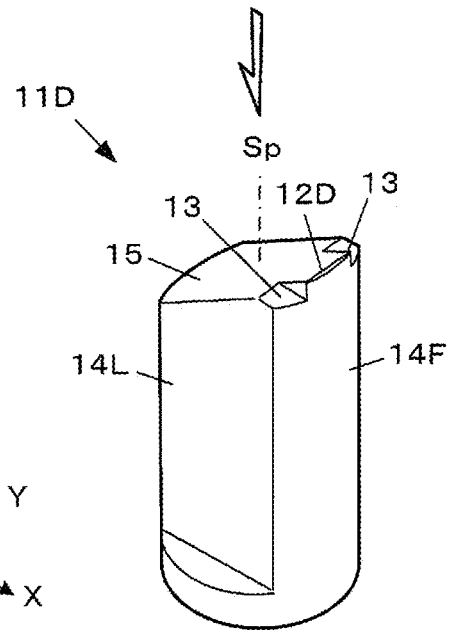
FIG. 15 is a view showing a modification of the distal end portion of the contact probe according to the first embodiment.

For example, an area of a protruding portion 12D may be made smaller than that of the protruding portion 12 according to the first embodiment, as in a distal end portion 11D shown in FIG. 15, based on the distal end portion 11A according to the first embodiment. Furthermore, the flat surface may be made smaller so as to disappear, and the distal end of the protruding portion 12D may have an inclined shape.

Figure 16:
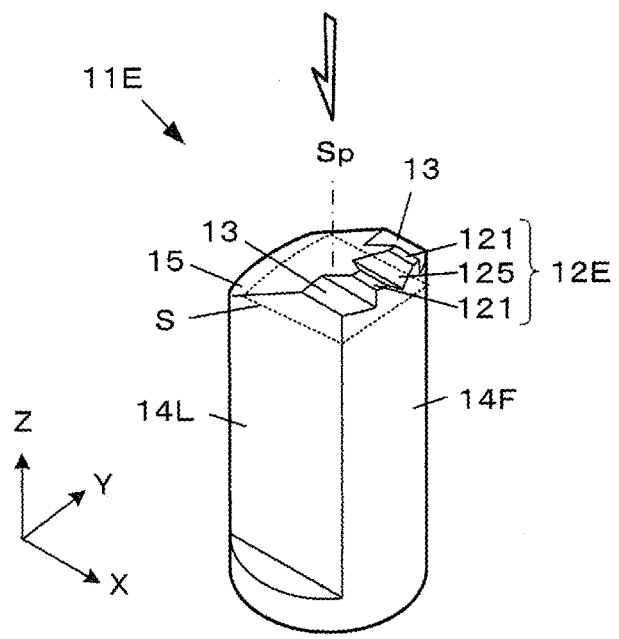
FIG. 16 is a view showing a modification of the distal end portion of the contact probe according to the first embodiment.

Further, for example, a V-shaped notch 125 along the front-rear direction (the X axis direction) may be formed in a central portion (a central portion in the Y axis direction) of a protruding portion 12E in the left-right direction, as in a distal end portion 11E shown in FIG. 16, based on the distal end portion 11A according to the first embodiment. Left and right protruding end surfaces 121 with the notch 125 interposed therebetween are end surfaces excluding the notch 125 from the protruding portion 12 according to the first embodiment. An area of a distal end of the protruding portion 12E when the protruding portion 12E enters the dimple 82 (the recess) is smaller than an area of the end surface of the protruding portion 12 according to the first embodiment since the area of the distal end of the protruding portion 12E is an area of the protruding end surface 121. A volume of the protruding portion 12E is smaller than that of the protruding portion 12 according to the first embodiment by an amount of the notch 125. Therefore, when a foreign matter remains in the dimple 82, even when the protruding portion 12 according to the first embodiment interferes depending on a size and an amount of the foreign matter, the protruding portion 12E may not interfere. As compared with the protruding portion 12 according to the first embodiment, the protruding portion 12E is less likely to be affected by the foreign matter.

Even when the distal end portion 11E comes into contact with the dimpled terminal portion 81 in a positional relation in which the protruding portion 12E is separated from the dimple 82, since the contact area is the area of the protruding end surface 121, the protruding portion 12E is less likely to pinch the foreign matter as compared with the protruding portion 12 according to the first embodiment.

Figure 17:
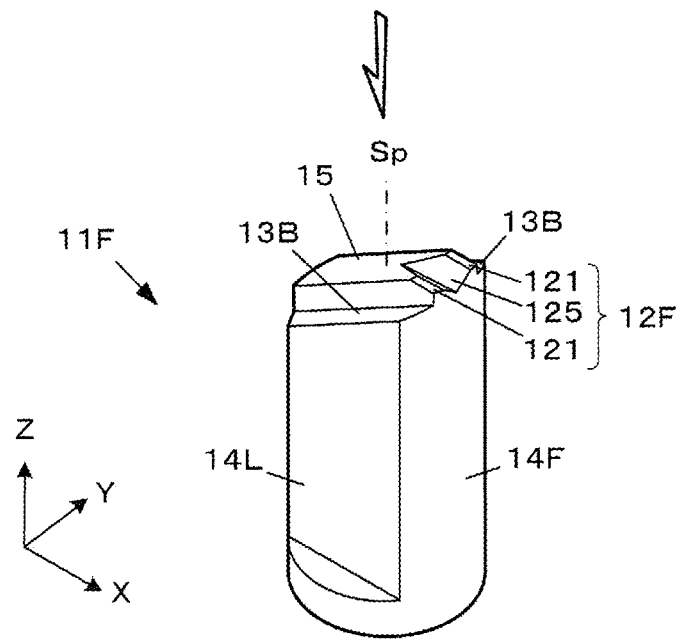
FIG. 17 is a view showing a modification of the distal end portion of the contact probe according to the second embodiment.

Similarly, for example, the V-shaped notch 125 along the front-rear direction (the X axis direction) may be formed in a central portion (a central portion in the Y axis direction) of a protruding portion 12F in the left-right direction, as in a distal end portion 11F shown in FIG. 17, based on the distal end portion 11B according to the second embodiment. The left and right protruding end surfaces 121 with the notch 125 interposed therebetween are end surfaces excluding the notch 125 from the protruding portion 12 according to the second embodiment.

A shape of the notch 125 is not limited to a V shape, and may be an arc shape in cross section. The shape of the notch 125 is preferably a shape in which the notch 125 is formed in a groove shape over lengths of the protruding portions 12E, 12F in the front-rear direction (the X axis direction).

In the distal end portion 11E shown in FIG. 16 or the distal end portion 11F shown in FIG. 17, the protruding end surface 121 may be a flat surface, or may have a ridgeline shape in which a width of the protruding end surface 121 in the Y axis direction is extremely reduced according to the size of the notch 125.

Similarly, the notch 125 may be formed also in the protruding portion 12D in FIG. 15.

Figure 18:
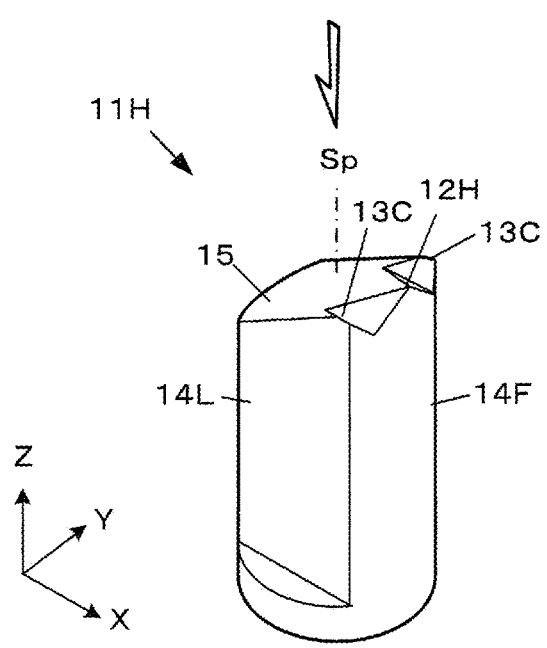
FIG. 18 is a view showing a modification of the distal end portion of the contact probe according to the third embodiment.

For example, a protruding portion 12H may have a cone or pyramid shape by shortening a ridgeline of a protruding end of the protruding portion 12H to a point, as in a distal end portion 11H shown in FIG. 18, based on the distal end portion 11C according to the third embodiment.

Similarly, based on the distal end portion 11E shown in FIG. 16, the lengths of the two protruding end surfaces 121 (the ridgeline portions) of the protruding end of the protruding portion 12E in the X axis direction may be reduced, and each protruding end surface 121 may have a cone or pyramid shape as the protruding portion 12H of the distal end portion 11H shown in FIG. 18. A point is obtained when the width of the protruding end surface 121 in the Y axis direction and the length of the protruding end surface 121 in the X axis direction are reduced to the utmost limit.

Similarly, based on the distal end portion 11F shown in FIG. 17, the lengths of the two protruding end surfaces 121 (the ridgeline portions) of the protruding end of the protruding portion 12F in the X axis direction may be reduced, and each protruding end surface 121 may have a cone or pyramid shape as the protruding portion 12H of the distal end portion 11H shown in FIG. 18. A point is obtained when the width of the protruding end surface 121 in the Y axis direction and the length of the protruding end surface 121 in the X axis direction are reduced to the utmost limit.

Figure 19:
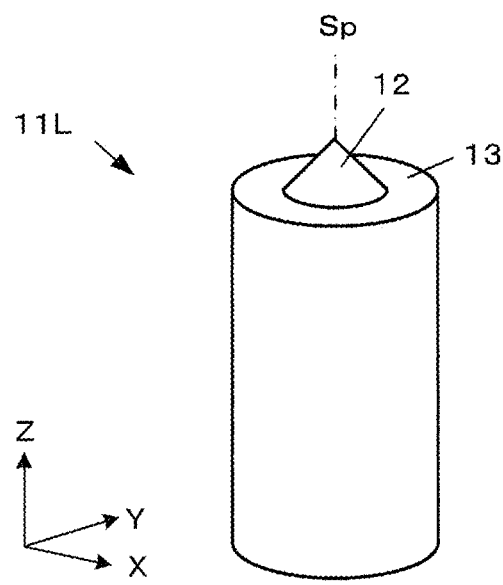
FIG. 19 is a view showing a modification of the distal end portion of the contact probe.
Figure 20:
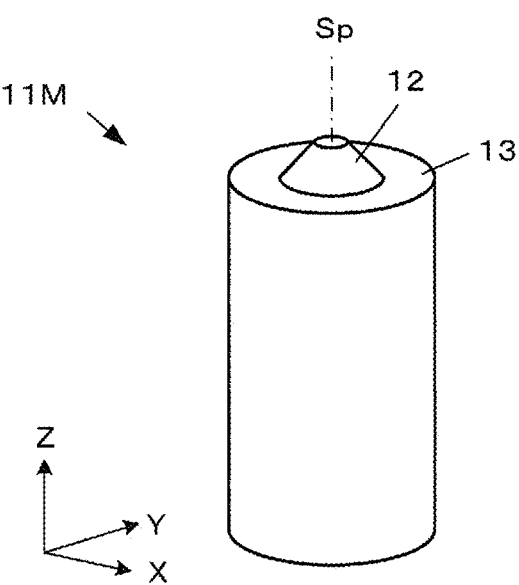
FIG. 20 is a view showing a modification of the distal end portion of the contact probe.
Figure 21:
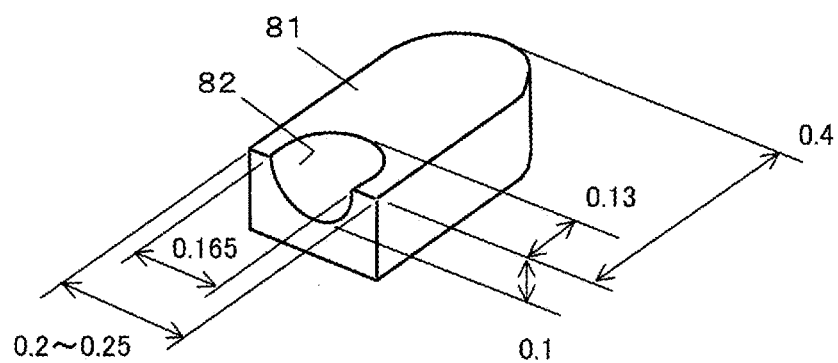
FIG. 21 is a perspective view showing an example of the dimpled terminal portion.
Figure 22:
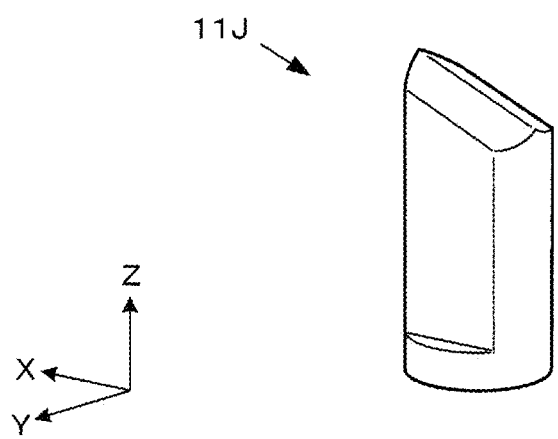
FIG. 22 is an enlarged perspective view (No. 1) of a distal end portion of a related-art contact probe.
Figure 23:
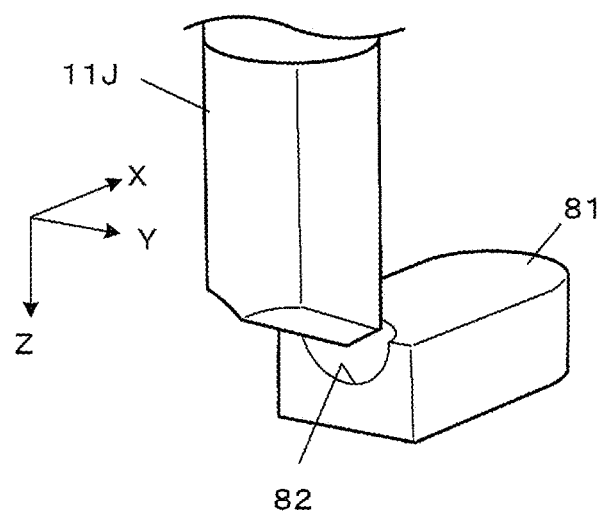
FIG. 23 is a view showing a state in which the related-art contact probe is brought into contact with a dimpled terminal portion.
Figure 24:
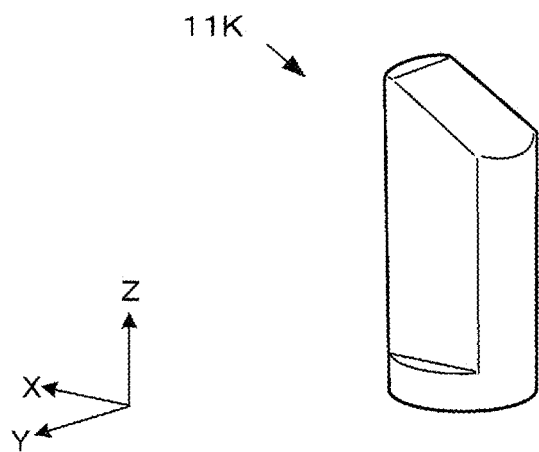
FIG. 24 is an enlarged perspective view (No. 2) of the distal end portion of the related-art contact probe.

As in the distal end portion 11L in FIG. 19 or the distal end portion 11M in FIG. 20, the protruding portion 12 may be provided on an extension line of the probe axis Sp. In the distal end portion 11L in FIG. 19, the protruding portion 12 has a cone shape in which a vertex is located on the extension line of the probe axis Sp. In the distal end portion 11M in FIG. 20, the protruding portion 12 has a truncated cone shape in which the extension line of the probe axis Sp is a rotation axis.

The disclosed content of the present specification can be summarized as follows.

An aspect of the present disclosure provides a contact probe capable of being used for an inspection of a semiconductor package in which a recess is formed in a terminal portion, the contact probe including a plunger including a distal end portion that comes into contact with the terminal portion, in which the distal end portion includes a protruding portion protruding toward the terminal portion and a shoulder portion having a protruding height toward the terminal portion lower than that of the protruding portion.

According to the present aspect, when the contact probe attempts to come into contact with the terminal portion, the protruding portion enters a recess, while the shoulder portion comes into contact with an outer peripheral portion (a flat surface around the recess of the terminal portion) of the recess of the terminal portion. Therefore, even in a situation in which a foreign matter such as dust or a cutting powder remains in the recess and a foreign matter is interposed between the protruding portion and an inside of the recess, conduction (electrical connection) is secured by the contact of the shoulder portion with the terminal portion, and an accurate inspection can be executed. Further, according to the present aspect, since the shoulder portion is less likely to come into contact with the molding material around the terminal portion, a life of the contact probe can be extended. The contact probe suitable for the inspection of the semiconductor package in which the recess is formed in the terminal portion can be implemented.

In the contact probe according to the present aspect, even if the contact probe is used for the inspection of the semiconductor package having a flat terminal portion without a recess, since the protruding portion is brought into contact with the contact probe to secure the conduction, it is also possible to execute an accurate inspection.

A difference between the protruding height of the protruding end of the protruding portion and the protruding height of the shoulder portion may be smaller than a depth of the recess.

Accordingly, even if a foreign matter is present in the recess, the conduction executed by the shoulder portion can be secured.

The distal end portion may have a shape in which a cross-sectional area of a probe cross section decreases toward a distal end.

Accordingly, the distal end of the contact probe can have a shape in which the cross-sectional area is smaller toward the distal end. When the number of the protruding portions of the distal end is one, the shape is tapered as a whole. Since the area in which the contact probe is in contact with the terminal portion is small, a contact pressure per unit area can be increased and reliable contact can be achieved. By providing the protruding portion offset from a probe center in the distal end front view, it is easy to execute the so-called Kelvin measurement in which the protruding portions of the two contact probes are brought into contact with one terminal portion and measured.

The shoulder portion is provided as a plurality of shoulder portions and may be located around the protruding portion.

Accordingly, it is easy to secure the conduction executed by the shoulder portion regardless of a direction in which the protruding portion deviates with respect to the recess.

A protruding end of the protruding portion may have a flat shape.

Accordingly, even if the contact probe is used for the inspection of the semiconductor package having the flat terminal portion without a recess, the protruding portion is easily brought into surface contact or line contact with the terminal portion, and the conduction is easily secured.

A protruding end of the protruding portion may have a chevron shape.

A protruding end of the protruding portion may have a cone or pyramid shape.

The protruding portion may have a notch.

A distal end of the shoulder portion may have a flat shape.

Accordingly, the contact between the shoulder portion and the outer peripheral portion of the recess of the terminal portion is likely to be a surface contact or a line contact, and the conduction can be easily secured.

A distal end of the shoulder portion may have an inclined shape.

A distal end of the shoulder portion may have a chevron shape.

Accordingly, the contact between the shoulder portion and the outer peripheral portion of the recess of the terminal portion is likely to be a point contact, and it is possible to reduce a chance that the foreign matter is interposed at a contact position as compared with a case of the surface contact or the line contact.

REFERENCE SIGNS LIST 10 contact probe
11A, 11B, 11C, 11D, 11E, 11J, 11K, 11L, 11M distal end portion
12, 12C, 12D, 12E protruding portion
13, 13B, 13C shoulder portion
14B back surface
14F front surface
14L flat surface
14R flat surface
15 inclined surface
80 semiconductor package
81 dimpled terminal portion
82 dimple (recess)
S probe cross section
Sp probe axis

The invention claimed is:

1. A system comprising a semiconductor package in which a recess is formed in a terminal portion and a contact probe for inspection of the semiconductor package, the contact probe comprising:
  a plunger including a distal end portion that comes into contact with the terminal portion, wherein the distal end portion includes
    a protruding portion protruding toward the terminal portion, and
    a shoulder portion having a protruding height toward the terminal portion lower than that of the protruding portion, and
    the protruding portion and the shoulder portion are configured to electrically conduct with the terminal portion.

2. The system according to claim 1, wherein a difference between the protruding height of the protruding portion and the protruding height of the shoulder portion is smaller than a depth of the recess.

3. The system according to claim 2, wherein the distal end portion has a shape in which a cross-sectional area of a probe cross section decreases toward a distal end.

4. The system according to claim 2, wherein a protruding end of the protruding portion has a chevron shape.

5. The system according to claim 2, wherein a protruding end of the protruding portion has a cone or pyramid shape.

6. The system according to claim 2, wherein the protruding portion has a notch.

7. The system according to claim 1, wherein the distal end portion has a shape in which a cross-sectional area of a probe cross section decreases toward a distal end.

8. The system according to claim 7, wherein the shoulder portion is provided as a plurality of shoulder portions and located around the protruding portion.

9. The system according to claim 1, wherein the shoulder portion is provided as a plurality of shoulder portions and located around the protruding portion.

10. The system according to claim 9, wherein a protruding end of the protruding portion has a flat shape.

11. The system according to claim 1, wherein a protruding end of the protruding portion has a flat shape.

12. The system according to claim 1, wherein a protruding end of the protruding portion has a chevron shape.

13. The system according to claim 1, wherein a protruding end of the protruding portion has a cone or pyramid shape.

14. The system according to claim 1, wherein the protruding portion has a notch.

15. The system according to claim 14, wherein a distal end of the shoulder portion has a flat shape.

16. The system according to claim 14, wherein a distal end of the shoulder portion has an inclined shape.

17. The system according to claim 14, wherein a distal end of the shoulder portion has a chevron shape.

18. The system according to claim 1, wherein a distal end of the shoulder portion has a flat shape.

19. The system according to claim 1, wherein a distal end of the shoulder portion has an inclined shape.

20. The system according to claim 1, wherein a distal end of the shoulder portion has a chevron shape.

21. The system according to claim 1, wherein a protruding end of the protruding portion has a flat shape, and a normal line of the flat shape is parallel to a prove axis of the contact probe.

22. A system comprising a semiconductor package in which a recess is formed in a terminal portion and a contact probe for inspection of the semiconductor package, the contact probe comprising:
- a plunger including a distal end portion that comes into contact with the terminal portion, wherein the distal end portion includes
  - a protruding portion protruding toward the terminal portion, and
  - a shoulder portion having a protruding height toward the terminal portion lower than that of the protruding portion,
- the distal end portion is configured such that the shoulder portion does not come into contact with the terminal portion when the protruding portion comes into contact with the terminal portion and that the shoulder portion comes into contact with the terminal portion when the protruding portion does not come into contact with the terminal portion.

* * * * *